US 6,674,073 B2

(12) United States Patent
Mukasa et al.

(10) Patent No.: US 6,674,073 B2
(45) Date of Patent: *Jan. 6, 2004

(54) SCATTERING TARGET-HOLDING MECHANISM AND AN ELECTRON SPIN ANALYZER

(75) Inventors: Koichi Mukasa, Hokkaido (JP); Masayuki Ikeda, Hokkaido (JP); Kazuhisa Sueoka, Hokkaido (JP); Masakazu Mutoh, Hokkaido (JP); Hisao Kadono, Hokkaido (JP); Eisuke Ueda, Hokkaido (JP)

(73) Assignee: Hokkaido University, Hokkaido (JP)

( * ) Notice: Subject to any disclaimer, the term of this patent is extended or adjusted under 35 U.S.C. 154(b) by 234 days.

This patent is subject to a terminal disclaimer.

(21) Appl. No.: 09/842,442

(22) Filed: Apr. 26, 2001

(65) Prior Publication Data

US 2002/0003212 A1 Jan. 10, 2002

(30) Foreign Application Priority Data

Apr. 28, 2000 (JP) ........................................ 2000-130224

(51) Int. Cl.⁷ .......................... H01J 37/252; H01J 37/20
(52) U.S. Cl. ....................... 250/305; 250/310; 250/398; 250/400; 250/440.11; 313/363.1
(58) Field of Search ................................. 250/305, 398, 250/400, 440.11, 310; 313/363.1

(56) References Cited

U.S. PATENT DOCUMENTS 4,658,138 A    4/1987   Koike et al. ................ 250/310
4,760,254 A  * 7/1988   Pierce et al. ................ 250/305
5,166,522 A   11/1992   Koike et al. ................ 250/310
2002/0003213 A1 1/2002  Mukasa et al. ............. 250/310

FOREIGN PATENT DOCUMENTS

| JP | 60017846 A | 1/1985 |
| JP | 60105152 A | 6/1985 |
| JP | 63284690 A | 11/1988 |
| JP | 10020044 A | 1/1998 |

OTHER PUBLICATIONS

J.C. Lancaster, et al., Source of potential systematic error in retarding–potential Mott polarimeters, 1999 American Institute of Physics, Review of Scientific Instruments vol. 70, No. 7, Jul. 1999, pp. 3186–3187.

* cited by examiner

*Primary Examiner*—Nikita Wells
(74) *Attorney, Agent, or Firm*—Knobbe Martens Olson & Bear, LLP

(57) ABSTRACT

A scattering target constituting an electron spin analyzer is supported by a scattering target-holding member made of a conductive material from the outside of the space formed by an accelerating electrode and an electrode supporter. Then, the scattering target-holding member is supported in insulation by an insulation supporting member made of an insulating material. Moreover, a guiding member is provided so as to cover the periphery of the insulation supporting member for guiding the scattering target, the scattering target-holding member and the insulation supporting member.

3 Claims, 1 Drawing Sheet

SCATTERING TARGET-HOLDING MECHANISM AND AN ELECTRON SPIN ANALYZER

BACKGROUND OF THE INVENTION

1) Field of the Invention

This invention relates to a scattering target-hojding mechanism and an electron spin analyzer, particularly, to a scattering target-holding mechanism and an electron spin analyzer which are preferably usable for a high efficiency electron spin analyzer such as an electronic material analyzer and a magnetic material surface analyzer.

2) Description of the Prior Art

In a small electron spin analyzer to carry out a spin analysis of an accelerated electron by 20–60 keV it is not easy to exchange a scattering target because of a small inside space of the analyzer. Therefore, in the above conventional electron spin analyzer, unless an analyzer equipment body including a vacuum chamber is detached from the analyzer, the scattering target can not be exchanged.

On the other hand, analyzing performance of the electron spin analyzer depends on the thickness of a scattering target. Moreover, it is effective in evaluating quantitative determination of the electron spin analyzer to measure the analyzing performances dependency upon the tarset thickness. However, it is not easy to exchange the scattering target by the conventional technique, so that a highly quantitative determination can not be ensured in the above conventional analyzer.

SUMMERY OF THE INVENTION

It is an object of the present invention to provide a new scattering target-holding mechanism to make the exchange of the scattering target easy, and to provide an electron spin analyzer having the scattering target-holding mechanism to make the exchange of the scattering target easy.

For achieving the above object, this invention relates to a scattering target-holding mechanism comprising a scattering target holder made of a conductive material to hold a scattering target, an insulating supporter made of an insulating material to support in insulation the scattering target holder, and a guiding member to guide the scattering target holder and the insulating supporter to a given position at which the scattering target is set.

Further, this invention also relates to an electron spin analyzer comprising an electron beam-generating apparatus, a hemisphere accelerating electrode provided opposite to an electron beam-discharging hole of the electron beam-generating apparatus, an electrode supporter to support the accelerating electrode, a scattering electron detector provided on the outer surface of the accelerating electrode, a scattering target provided in an opening formed at the electrode supporter, a scattering target-holding member made of a conductive material to hold the scattering target from the outside of a space formed by the accelerating electrode and the electrode supporter, an insulation supporting member made of an insulating material to support in insulation the scattering target-holding member, and a guiding member covering the periphery of the insulation supporting member to put on and take off the scattering target, the scattering target-holding member and the insulation supporting member together.

According to the scattering target-holding mechanism and the electron spin analyzer of the present invention, the scattering target is supported by the scattering target-holding member from the outside of the space formed by the accelerating electrode and the accelerating electrode supporter, and the scattering target-holding member is supported in insulation by the insulation supporting member.

Then, the guiding member is provided so as to cover the periphery of the insulation supporting member, and thereby, the scattering target-holding member and the insulation supporting member can be put on and taken off together along the guiding member. As a result, the exchange of the scattering target can be performed easily.

Moreover, since the scattering target-holding member is made of a conductive material and the insulation supporting member is made of an insulating material, a current can be supplied to the scattering target from the outside. That is, the scattering target-holding member and the insulation supporting member serve as an electrode for the scattering target. Therefore, another electrode member is not required in addition to the above members, so that the electron spin analyzer according to the present invention can have a simple construction.

BRIEF DESCRIPTION OF THE DRAWINGS

For better understanding of the present invention, reference is made to the attached drawings, wherein.

DESCRIPTION OF THE PREFERRED EMBODIMENTS

This invention will be described in detail with reference to figures.

Figure 1:
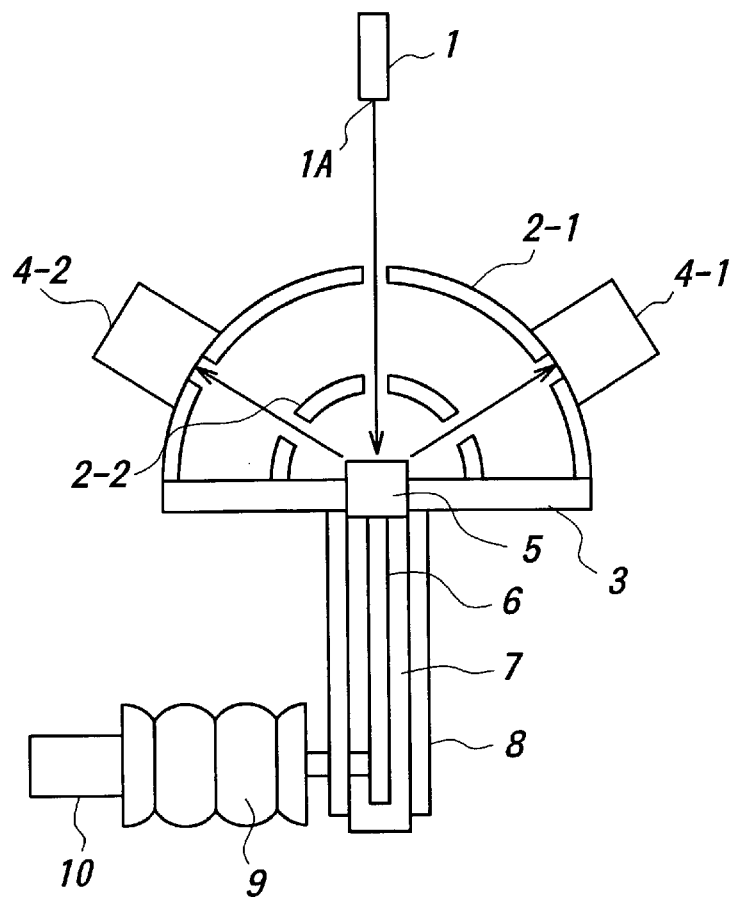
FIG. 1 is a schematic view showing the construction of an embodiment in the electron spin analyzer of the present invention.

FIG. 1 is a schematic view showing an embodiment in the electron spin analyzer of the present invention, having a scattering target of the present invention.

An electron spin analyzer shown in FIG. 1 has an electron beam-generating apparatus 1, a hemisphere accelerating electrode, which is provided opposite to the electron beam-discharging hole 1A of the electron beam-generating apparatus 1, composed of an outer electrode 2-1 and an inner electrode 2-2, an electrode supporter 3, a pair of scattering electron detectors 4-1 and 4-2 provided on an outer surface of the outer electrode 2-1 constituting an accelerating electrode, and a scattering target 5 formed in an opening of the electrode supporter 3 inside the accelerating electrode.

The scattering target 5 is supported by a scattering target-holding member 6 from the outside of a space formed by the outer electrode 2-1 constituting the accelerating electrode and the electrode supporter 3. The outer surface of the scattering target-holding member 6 is supported in insulation by an insulation supporting member 7. Moreover, a guiding member 8 is provided along the outer surface of the insulation supporting member 7.

Figure 2:
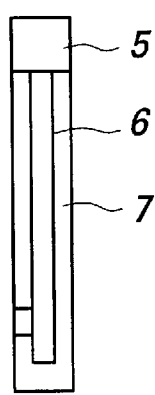
FIG. 2 is a schematic view showing the state in which a scattering target, a scattering target-holding member and an insulation supporting member are taken off along a guiding member out of the electron spin analyzer shown in FIG. 1.

According to the construction of the electron spin analyzer shown in FIG. 1, since as shown in FIG. 2, the scattering target 5, the scattering target-holding member 6 and the insulation supporting member 7 can be put on and taken off freely along the guiding member 8, the scattering target can be easily exchanged.

Moreover, the scattering target-holding member 6 is made of a conductive material, and the insulation supporting member 7 is made of an insulating material. Therefore, a current can be introduced to the scattering target 5 through the scattering target-holding member 6, so the above members 6 and 7 serve as an electrode for the scattering target 5. That is, since another electrode is not required in addition to the above members, the electron spin analyzer can have a simple construction.

Furthermore, although not described clearly in FIG. 1, the electron beam-generating apparatus 1 is entirely installed through the guiding member 8 in a given vacuum chamber. A given current is then introduced to the scattering target-holding member 6 from a high voltage-introducing terminal 10 provided at the outside of the vacuum chamber via an insulator 9 piercing through a wall of the vacuum chamber.

As the conductive material constituting the scattering target-holding member 6, a non-magnetic stainless steel and a non-magnetic conductive material such as titanium, molybdenum and tungsten may be exemplified.

As the insulating material constituting the insulation supporting member 7, alumina, aluminum nitride, silicon dioxide and sapphire may be exemplified.

The guiding member 8 may be made of a non-magnetic and mechanically strong material such as non-magnetic stainless steel, molybdenum and tungsten.

In FIG. 1, the trace of the electron beam is depicted by arrows, and thus, an electron beam from the electron beam-generating apparatus 1 is introduced and impinged onto the scattering target 5 to be scattered toward the electron beam detectors 4-1 and 4-2.

Although the present invention was described in detail with reference to the above example, this invention is not limited to the above disclosure and every kind of variation and modification may be made without departing from the scope of the present invention.

As explained above, according to the present invention, the scattering target can be easily exchanged in the electron spin analyzer. Therefore, working operation and working time for exchanging the scattering target can be made very efficient and the quantitative determination of the analyzer can easily be evaluated.

What is claimed is:

1. A scattering target-holding mechanism comprising a scattering target holder made of a conductive material to hold a scattering target, an insulating supporter made of an insulating material to support the insulated scattering target holder, and a guiding member to guide the scattering target holder and the insulating supporter to a given position at which the scattering target is set.

2. An electron spin analyzer comprising an electron beam-generating apparatus, a hemisphere accelerating electrode provided opposite to an electron beam-discharging aperture of the electron beam-generating apparatus, an electrode supporter to support the accelerating electrode, a scattering electron detector provided on the outer surface of the accelerating electrode, a scattering target provided in an opening formed at the electrode supporter, a scattering target-holding member made of a conductive material to hold the scattering target from the outside of a space formed by the accelerating electrode and the electrode supporter, an insulation supporting member made of an insulating material to support the insulated scattering target-holding member, and a guiding member covering the periphery of the insulation supporting member to put on and take off the scattering target, the scattering target-holding member and the insulation supporting member together.

3. An electron spin analyzer as defined in claim 2, wherein the accelerating electrode is composed of an inner electrode and an outer electrode.

* * * * *